United States Patent [19]

Wada et al.

[11] 4,377,421

[45] Mar. 22, 1983

[54] METHOD OF MAKING A STACKED EMITTER IN A BIPOLAR TRANSISTOR BY SELECTIVE LASER IRRADIATION

[75] Inventors: Yasuo Wada, Tokyo; Takahide Ikeda; Masao Tamura, both of Tokorozawa, all of Japan

[73] Assignee: Hitachi, Ltd., Tokyo, Japan

[21] Appl. No.: 186,743

[22] Filed: Sep. 12, 1980

[30] Foreign Application Priority Data

Sep. 12, 1979 [JP] Japan .................. 54/116080

[51] Int. Cl.³ ........................................ H01L 21/263
[52] U.S. Cl. .................... 148/1.5; 29/576 B; 148/187; 219/121 LF; 357/91; 427/53.1
[58] Field of Search ............... 148/1.5, 187; 357/91; 219/121 L, 121 F; 427/53.1; 29/576 B

[56] References Cited

U.S. PATENT DOCUMENTS

| | | | |
|---|---|---|---|
| 3,585,088 | 6/1971 | Schwuttre | 148/1.5 |
| 4,181,538 | 1/1980 | Narayan et al. | 148/1.5 |
| 4,214,918 | 7/1980 | Gat et al. | 148/1.5 |
| 4,243,433 | 1/1981 | Gibbons | 148/1.5 |
| 4,269,631 | 5/1981 | Anantha et al. | 148/1.5 |

OTHER PUBLICATIONS

Anantha et al., IBM-TDB, vol. 22(2), (Jul. 1979), 575-576.
Celler, J. Appl. Phys., 32(8), (1978), 464.
Shah et al., in Int.ⁿ. Electron Device Meeting, Washington, D.C., Dec. 1979, pp. 216-219.
Koyanagi et al., Appl. Phys. Letts. 35, (Oct. 1979), 621.
Tsuchimoto et al., Solid State Electronics, 19, (1976), 1042-1043.

*Primary Examiner*—Upendra Roy
*Attorney, Agent, or Firm*—Antonelli, Terry & Wands

[57] ABSTRACT

An insulating film is formed on a semiconductor substrate, and the insulating film on that part of the semiconductor substrate where an emitter is to be formed, is removed to expose the surface of the above part. A polycrystalline or amorphous silicon film is deposited on the entire surface, and then irradiated with a laser beam to convert that portion of the polycrystalline or amorphous silicon film which is deposited on the surface of the semiconductor substrate without interposing the insulating film therebetween, into a single crystal of silicon, thereby forming a stacked emitter.

12 Claims, 11 Drawing Figures

METHOD OF MAKING A STACKED EMITTER IN A BIPOLAR TRANSISTOR BY SELECTIVE LASER IRRADIATION

BACKGROUND OF THE INVENTION

1. Field of the Invention

The present invention relates to a method of fabricating a semiconductor device, and more particularly to a method of fabricating a high-performance bipolar transistor by the use of laser irradiation.

2. Description of the Prior Art

As is well known, in order to obtain a high performance bipolar transistor, it is required to make small the depth of he emitter junction and to make the carrier injection from the side face of the emitter in the lateral direction as little as possible.

To fulfill these requirements, there has been proposed a method in which, as is shown in FIG. 1 of the accompanying drawings, a principal surface of a semiconductor substrate 1 is coated with an insulating film 2, that part of the insulating film 2 where an emitter is to be formed, is removed to expose the surface of the semiconductor substrate 1, and a semiconductor film 3 is epitaxially grown on the exposed surface of the substrate 1 to form an emitter. Incidentally, reference numerals 5 and 6 in FIG. 1 designate a base and a collector, respectively.

Such an emitter, namely, an emitter formed on a substrate is called "a stacked emitter". Since the stacked emitter is formed on a substrate and moreover the side faces of the emitter are kept in contact with an insulating film, a transistor with a stacked emitter has an advantage such that the carrier injection in the lateral direction scarcely takes place and therefore high frequency characteristics are greatly improved.

However, since a conventional stacked emitter has been formed by epitaxial growth, a prior art method of forming the stacked emitter necessitates a complicated process, is required to strictly meet various process conditions, and therefore is low in productivity. Further, the prior art method has such a drawback that an epitaxial layer, as shown in FIG. 1, is apt to grow obliquely at that end portion thereof which is kept in contact with the insulating film 2, thereby forming a facet 4 thereat to lower reliability.

SUMMARY OF THE INVENTION

It is an object of the present invention to provide a method of fabricating a semiconductor device which is free from difficulties encountered with a conventional method of fabricating a semiconductor device, and can readily provide a high-performance bipolar transistor.

It is another object of the present invention to provide a method of fabricating a reliable bipolar transistor in which a stacked emitter having no facet is formed.

To attain these and other objects, according to the present invention, a selected portion of a polycrystalline silicon film is converted by laser irradiation to a monocrystalline layer to form a stacked emitter.

DESCRIPTION OF THE PREFERRED EMBODIMENTS

EMBODIMENT I

An embodiment of the present invention will be explained in detail with reference to FIGS. 2a to 2g.

Figure 1:
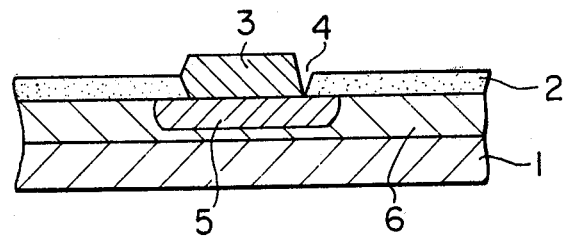
FIG. 1 is a sectional view showing a bipolar transistor with a stacked emitter formed in accordance with a prior art method.
Figure 2A:
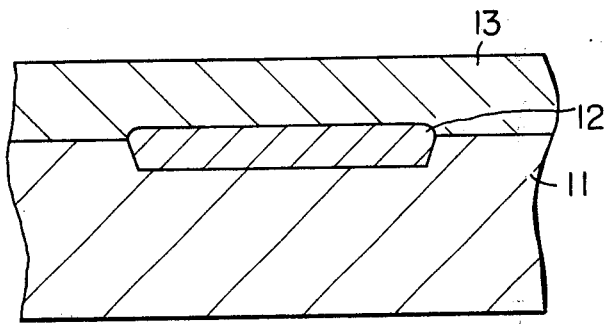
FIGS. 2a to 2g sectional views illustrating various steps in an embodiment of a fabricating method according to the present invention.

Referring to FIG. 2a, arsenic (As) is diffused into a p-type silicon substrate 11 having a resistivity of 20 $\Omega$cm to form a buried collector 12 having a sheet resistivity of 10 $\Omega/\square$, and further an $n^-$-type silicon layer 13 is epitaxially grown by the well-known vapor epitaxial growth method.

Figure 2B:
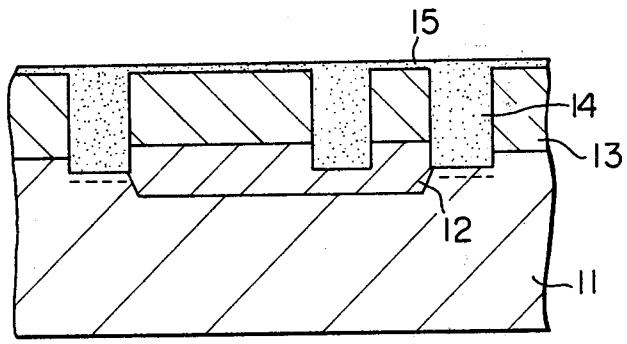

Holes are formed penetrating the $n^-$-type silicon layer 13 using an $Si_3N_4$ film as a mask, and boron ions are implanted in the silicon substrate through the holes to form channel stoppers. Then, the holes, as shown in FIG. 2b, are filled with $SiO_2$ to form isolation regions 14. Further, the surface of the resulting structure is oxidized so as to form a thin $SiO_2$ film 15.

Figure 2C:
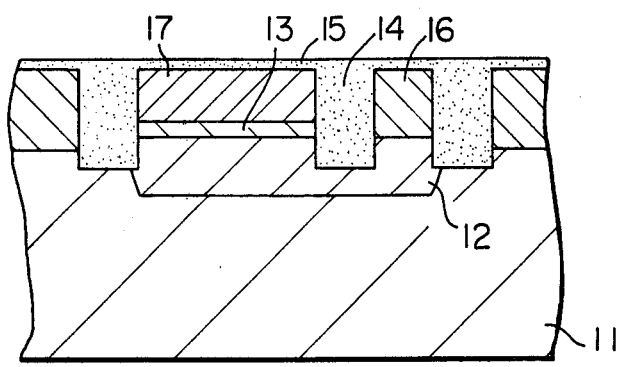

Then, $CN^+$ ions are diffused into a selected portion of the $n^-$-type silicon layer 13 to form an $n^+$-type low resistivity region 16 such as shown in FIG. 2c, and $B^+$ ions are implanted in another selected portion of the layer 13 at an implant dose of $2\times10^{14}$ cm$^{-2}$ to form a base 17.

Figure 2D:
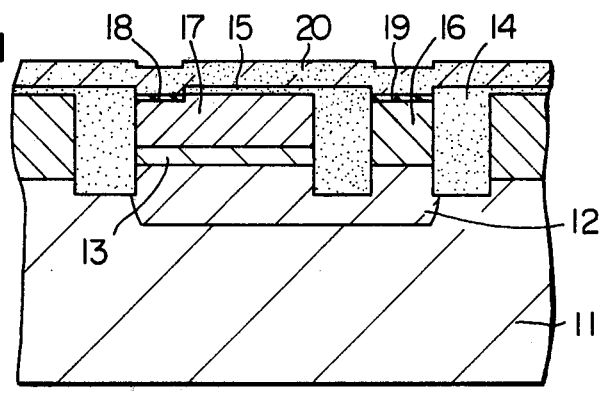

Those parts of the $SiO_2$ film 15 which are in contact with a selected portion of the base 17 and with the $n^+$-type region 16, are etched off, and $As^+$ ions are implanted in the selected portion of the base 17 and in the region 16 at an implant energy of 60 KeV and at an implant dose of $1\times10^{16}$ cm$^{-2}$, and then annealed at a temperature of 1,000° C. for 30 minutes to form $n^+$-type regions 18, 19 respectively, as shown in FIG. 2d.

A polycrystalline silicon film 20 having a thickness of about 0.4 $\mu$m is deposited on the entire surface by the well-known chemical vapor deposition (CVD) method utilizing thermal decomposition of $SiH_4$. After $As^+$ ions have been implanted in the entire surface of the polycrystalline silicon film 20 at an implant energy of 50 KeV and at an implant dose of $1\times10^{16}$ cm$^{-2}$, those parts of the film 20 which are deposited on the $n^+$-type regions 18, 19, are irradiated with a laser beam having an intensity of 1.5 J/cm$^2$ from a Q-switched ruby laser to selectively convert each of the irradiated parts of the polycrystalline silicon film 20 into a single crystal.

Figure 2E:
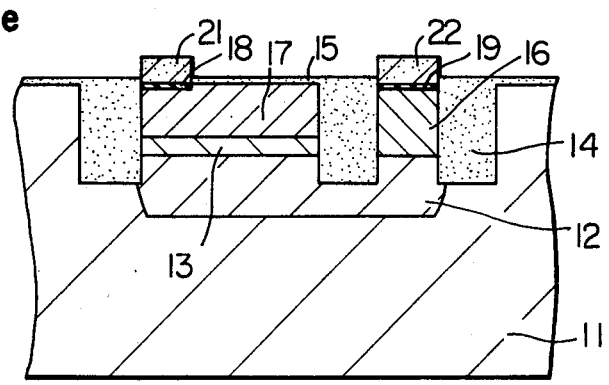

Next, the silicon film 20 is etched using an etchant containing 1 part by volume of fluoric acid, 50 parts by volume of nitric acid and 25 parts by volume of glacial acetic acid. Then, the polycrystalline silicon film 20 is etched off and only the monocrystallized parts of the film 20 are left unetched, since the etching speed of the etchant for the polycrystalline silicon is far higher than that for the monocrystalline silicon. Thus, a protruding emitter 21 and a collector leading electrode 22 are formed, as shown in FIG. 2e.

Figure 2F:
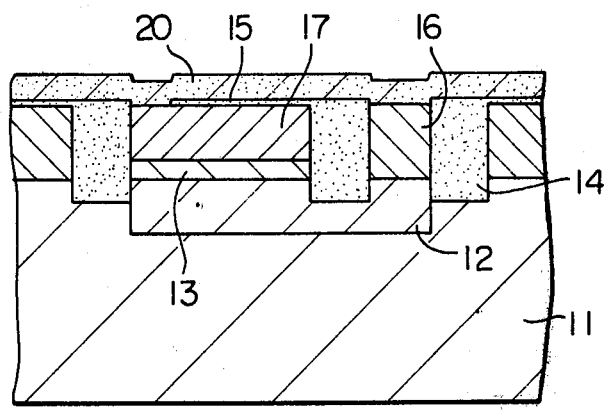
Figure 2G:
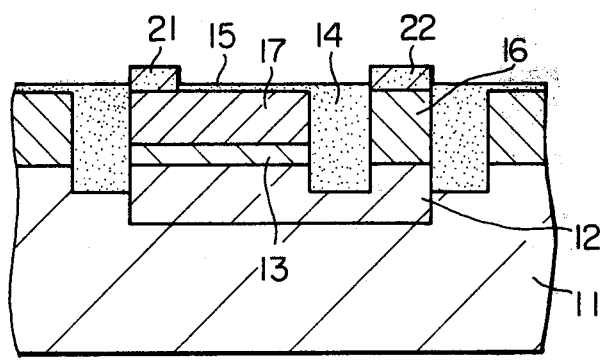

In this embodiment, ion implantation has been effected before the deposition of the polycrystalline silicon film 20, to form the $n^+$-type regions 18, 19. However, the above step may be omitted. That is, after the $SiO_2$ film 15 has been formed in the step shown in FIG. 2c, those parts of the $SiO_2$ film 15 which overlie the surface portions where the emitter and the collector leading electrode are to be formed are etched off, and then the polycrystalline silicon film 20 is deposited on the entire surface, as shown in FIG. 2f. A large number of impurities are introduced into the polycrystalline silicon film 20 by ion implantation or thermal diffusion, and then the polycrystalline silicon film 20 is irradiated with a laser beam in the same manner as the previously-mentioned, so as to selectively convert each of those parts of the polycrystalline silicon film 20, which are kept in direct contact with the monocrystalline silicon regoins 16 and 17, to a single crystal of silicon. Further, the remaining part of the polycrystalline silicon film 20 is etched off, and thus the protruding emitter 21 and the collector leading electrode 22 are formed, as shown in FIG. 2g.

EMBODIMENT II

In Embodiment I, there has been explained a case where an integrated circuit or large scale integrated circuit is formed in accordance with the present invention. Now, explanation will be made on another embodiment of the present invention which is applied to the fabrication of a discrete transistor, with reference to FIGS. 3a to 3c.

Figure 3A:
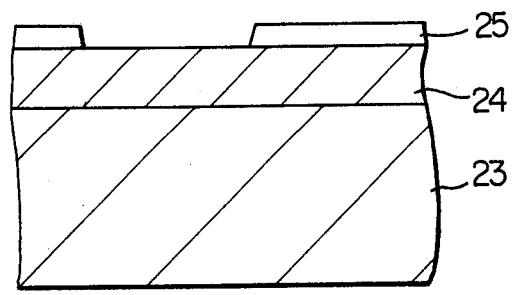
FIGS. 3a to 3c are sectional views illustrating various steps in another embodiment of a fabricating method according to the present invention.
Figure 3B:
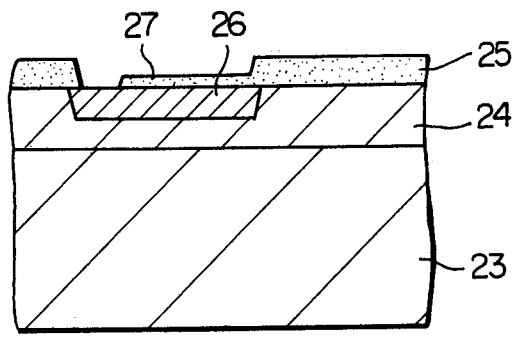

Referring to FIG. 3a, an $n^-$-type silicon layer 24 having a thickness of about 2 $\mu$m is formed on an $n^+$-type silicon substrate 23 by epitaxial growth, and the surface of the grown layer 24 is oxidized to form an $SiO_2$ film 25. Then, the $SiO_2$ film 25 on that region of the silicon layer 24 where a base is to be formed, is etched off. $B^+$ ions are implanted in the silicon layer 24 at an implant energy of 50 KeV and at an implant dose of $2 \times 10^{14}$ cm$^{-2}$ using the $SiO_2$ film 25 as a mask, and then subjected to heat treatment to form a base 26 such as shown in FIG. 3b. The exposed surface of the silicon layer 24 is slightly oxidized to form a thin $SiO_2$ film 27. Then, the thin $SiO_2$ film 27 on a region where an emitter is to be formed, is etched off.

Figure 3C:
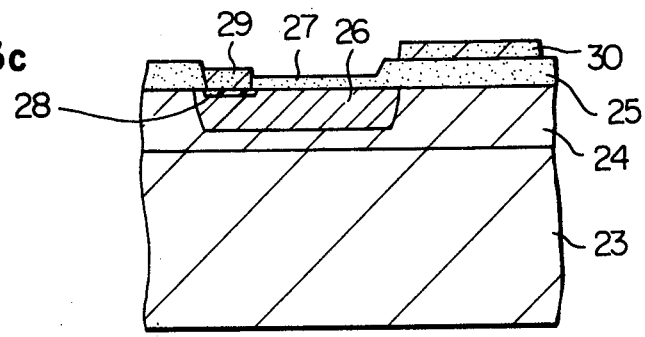

The silicon layer 24 is implanted with As ions at an implant energy of 50 KeV and at an implant dose of $1 \times 10^{16}$ cm$^{-2}$ using the $SiO_2$ films 25 and 27 as a mask, and then annealed at a temperature of 1,000° C. for 30 minutes to form an $n^+$-type region 28 such as shown in FIG. 3c. Like EMBODIMENT I, a polycrystalline silicon film is subsequently deposited on the entire surface, and then irradiated with a laser beam so as to convert a selected part of the polycrystalline silicon film to a single crystal, thereby forming an emitter 29 protruding from the substrate.

In the above embodiment, it is not necessarily required to form the emitter 28 in the silicon layer 24, and only the emitter 29 may be formed on the silicon layer 24.

When the $n^+$-type region 28 is formed in the silicon layer 24, the thickness of the region 28 should be smaller than the emitter 29 formed on the layer 24 in order to suppress the carrier injection from side faces of the emitter 28 to a negligibly one from the practical point of view. Further, the emitter 29 has advantages in that a metal for forming an emitter electrode is prevented from penetrating the emitter layer, and that the width of base can be readily controlled.

Further, all of the remaining polycrystalline silicon film may not be etched off with a desired portion 30 thereof selectively left unetched for use as a resistor. In this case, the resistor is formed in the emitter forming process and therefore such processing is desirable from the practical standpoint.

As mentioned above, according to the present invention, after an insulating film has been formed on a substrate, the surface of a region where an emitter is to be formed, is exposed, and then a polycrystalline silicon film is deposited on the entire surface. Subsequently, that part of the polycrystalline silicon film which is deposited on the exposed surface of the substrate, is converted to a single crystal of silicon by laser irradiation. Accordingly, a laser for irradiating the polycrystalline silicon film is required to be able to emit a laser beam having an intensity necessary for melting the polycrystalline silicon film and epitaxially growing a monocrystalline silicon layer on the substrate, that is, an intensity of about 0.8 J/cm$^2$ or more.

Although only those parts of the polycrystalline silicon layer which are to be converted to single crystals, have been irradiated with a laser beam in the above-mentioned embodiments, the present invention is not limited to such a case, but the entire surface of the polycrystalline silicon film may be irradiated with a laser beam.

In more detail, when the entire surface of the polycrystalline silicon film is irradiated with a laser beam having an energy intensity of about 2.5 J/cm$^2$ or more, that part of the polycrystalline silicon film which is deposited on the substrate without an insulating film therebetween, is melted and then epitaxially grown on the substrate to form a monocrystalline silicon film. On the other hand, the remaining polycrystalline silicon film which has been deposited on the insulating film, is melted by laser irradiation and attracted by the above monocrystalline silicon film to form a united single crystal. As a result, a monocrystalline silicon film is formed only on the substrate, and the polycrystalline silicon film on the insulating film vanishes so that the insulating film is exposed.

According to this method, the positional accuracy of the emitter is greatly improved since the emitter is formed in self-alignment, and moreover the step of removing the polycrystalline silicon film can be omitted since any part of the polycrystalline silicon film is never left on the insulating film. Therefore, this method is desirable from the practical point of view.

Further, when the entire surface of the polycrystalline silicon film is irradiated with a laser beam having an intensity of 0.8 to 2.5 J/cm$^2$, only that part of the polycrystalline silicon film, which is kept in direct contact with the substrate, is converted to a monocrystalline silicon film, and the remaining polycrystalline silicon film, which is deposited on the insulating film, is left unchanged. After laser irradiation, the silicon film is etched using, for example, an etchant containing fluoric acid and nitric acid. At this time, only the polycrystalline silicon film can be etched off while leaving the monocrystalline silicon film unetched, due to a difference in solubility between the polycrystalline and monocrystalline silicon films.

In the foregoing description, there has been shown only a case where a polycrystalline silicon film is employed, for convenience of explanation. However, it is possible to use an amorphous silicon film which is formed by, for example, the plasma deposition method, in place of the polycrystalline silicon film, since the amorphous silicon film is converted to a monocrystalline silicon film by laser irradiation and can produce the same satisfactory result as the polycrystalline silicon film. That is, the amorphous silicon film can be employed in the present invention.

As is evident from the foregoing explanation, the gist of the present invention resides in that a polycrystalline or amorphous silicon film is converted by laser irradiation to a monocrystalline silicon film to form a stacked emitter.

As explained previously, according to the present invention, there is no fear of a facet appearing between a stacked emitter and an insulating film, and therefore it is possible to form a very reliable semiconductor device. This is an excellent feature of the present invention which cannot be attained with the conventional fabricating method.

Further, the present invention has the following advantages: a fabrication process according to the present invention comprises simple steps and is therefore suitable for mass production, various process conditions have a large degree of freedom and therefore the fabrication process can be readily designed, and a high-performance semiconductor device can be formed because the carrier injection from the side wall is negligible, if any.

We claim:

1. A method of fabricating a semiconductor device comprising the steps of:
   (a) forming an insulating film on a principal surface of a semiconductor substrate;
   (b) removing that part of said insulating film which overlies a portion of said semiconductor substrate where an emitter is to be formed;
   (c) depositing a polycrystalline or amorphous silicon film on the entire surface; and
   (d) irradiating a selected portion of said polycrystalline or amorphous silicon film with a laser beam to convert that portion of said polycrystalline or amorphous silicon film, which is deposited on said principal surface of said semiconductor substrate without said insulating film therebetween, to a single crystal of silicon, whereby a stacked emitter can be formed protruding from the semiconductor substrate.

2. A method according to claim 1, wherein said portion of said polycrystalline or amorphous silicon film, which is deposited on said principal surface of said semiconductor substrate without said insulating film interposed therebetween, is selectively irradiated with said laser beam.

3. A method according to claim 1, wherein the entire surface of said polycrystalline or amorphous silicon film is irradiated with said laser beam.

4. A method according to claim 1, wherein, prior to said irradiating step, impurities are introduced into said polycrystalline or amorphous silicon film.

5. A method according to claim 1, wherein a base and collector are formed in said semiconductor substrate.

6. A method according to claim 1, wherein a polycrystalline silicon film is deposited in step (c) and wherein, after the irradiating step (d), the remaining polycrystalline silicon film except for a desired portion is etched off, said desired portion constituting a resistor.

7. A method according to claim 3, wherein said laser beam has an intensity of not smaller than about 2.5 J/cm$^2$.

8. A method according to claim 3, wherein said laser beam has an intensity of about 0.8 to 2.5 J/cm$^2$.

9. A method according to claim 2, wherein said laser beam has an intensity of not smaller than about 0.8 J/cm$^2$.

10. A method according to claim 5, wherein, in step (b), that part of the insulating film which overlies a portion of the semiconductor substrate on which a collector leading electrode is to be formed is also removed, whereby a stacked emitter and a collector leading electrode can simultaneously be formed protruding from the semiconductor substrate.

11. A method according to claim 1 or 5 wherein, after the irradiating step (d), the remaining polycrystalline or amorphous silicon film is etched off.

12. A method according to claim 2 or 9, wherein said polycrystalline or amorphous silicon film is selectively removed after irradiation of said laser beam.

* * * * *